United States Patent [19]

Boettner et al.

[11] 4,454,470
[45] Jun. 12, 1984

[54] METHOD AND APPARATUS FOR FREQUENCY MEASUREMENT OF AN ALTERNATING CURRENT SIGNAL

[75] Inventors: Fred H. Boettner; Loren H. Walker, both of Salem, Va.

[73] Assignee: General Electric Company, Salem, Va.

[21] Appl. No.: 335,377

[22] Filed: Dec. 29, 1981

[51] Int. Cl.³ .................................... G01R 23/02
[52] U.S. Cl. ........................ 324/78 R; 324/78 D; 324/78 E; 324/76 A
[58] Field of Search ............ 324/77 D, 76 A, 78 R, 324/78 D, 78 E, 78 Q, 78 Z, 83 D, 99 D, 111

[56] References Cited

U.S. PATENT DOCUMENTS

| | | | |
|---|---|---|---|
| 3,553,728 | 1/1971 | Frank et al. | 324/78 D |
| 3,590,277 | 6/1971 | South | 324/78 E |
| 3,803,486 | 4/1974 | Russell et al. | 324/78 Q |
| 4,112,358 | 9/1978 | Ashida | 324/78 D |
| 4,310,795 | 1/1982 | Fremereg | 324/83 D |
| 4,363,099 | 12/1982 | Srinivasan et al. | 324/83 D |

Primary Examiner—Michael J. Tokar
Assistant Examiner—B. J. Kelley
Attorney, Agent, or Firm—Arnold E. Renner

[57] ABSTRACT

A scheme for measuring the frequency of an alternating current signal provides for the development of first and second values which are respectively representative of the time the alternating current signal exist in alternate half cycles; e.g., the period of a half cycle. The most recently developed of the first and second values is retained and continuously compared with the other value which is presently being developed to thus provide an output signal representative of the greater thereof. This output signal is indicative of the period and, hence by its reciprocal, a measure of the apparent instantaneous frequency of the alternating current signal.

12 Claims, 3 Drawing Figures

METHOD AND APPARATUS FOR FREQUENCY MEASUREMENT OF AN ALTERNATING CURRENT SIGNAL

BACKGROUND OF THE INVENTION

The present invention relates generally to frequency measuring systems, and more particularly, to a method and apparatus for providing a frequency measuring system to give the best instantaneous value of the frequency, particularly when the frequency being measured is decreasing in value.

There are a number of frequency measuring systems available in today's art. In one form, the cycles of the signal being measured are counted for some unit of time to give a direct value of the frequency. At low frequencies, this method is undesirable because a long count period is needed to give adequate resolution. A somewhat more sophisticated approach to the measurement problem involves measuring the period of the waveform and inverting the value of the period to get frequency. Although this method provides better results than the direct counting method described above, it does not give the optimum results particularly when the frequency is low and is rapidly getting lower.

In the known period calculation method, the period is measured and this measured value is held until another complete period has occurred. The held value will not be changed until another time period has elapsed. If the signal is increasing in frequency, the next measured period will be shorter than the previous period and the frequency will be updated as soon as the new period is known. Thus, so long as the new period is shorter than the prior period, the frequency is being updated rapidly and no difficulties are encountered. If, however, the frequency is decreasing in value, the new period will be longer than the previous period reflecting the decrease in frequency. As soon as the period currently being measured exceeds the previous period, it is known that the frequency is lower than the value which is currently being used. This knowledge, however, does not appear in the system output until a new period is complete and, thus, it is seen that there is a time delay which represents an inaccuracy in the system and which is a deficiency in this method. In the extreme case, when the input frequency is zero, the held value will be that of the last complete period. Since the final period never terminates, the output will remain that of the last complete period and the zero frequency condition will not be indicated.

SUMMARY OF THE INVENTION

It is, therefore, an object of the present invention to provide a new and improved method and apparatus for the measurement of the frequency of an alternating current signal.

It is a further object to provide a frequency measurement system which finds particular application when the signal being measured is decreasing in frequency and which provides a more rapid indication of that decrease.

It is a still further object to provide a frequency measurement method and apparatus for an alternating current input signal which is relatively simple in construction and which provides an accurate and rapid indication of the frequency of the input signal.

The foregoing and other objects are achieved, in accordance with the present invention, by providing a system in which there are repetitively developed first and second values representative, respectively, of the time the alternating current signal being measured exist in alternate one-half cycles. The most recently developed of these values is retained and continuously compared to the value presently being developed. The result of this comparison, which provides an output signal representative of the larger of the two values and hence the longer of the two half cycles periods, is provided as an output. If desired, this output may be inverted to provide a signal directly proportional to the frequency or may be used indirectly as an indication of the apparent period.

BRIEF DESCRIPTION OF THE DRAWING

While the present invention is defined in particularity in the claims annexed to and forming a part of this specification, a better understanding can be had from the following description taken in conjunction with the accompanying drawings in which:

DETAILED DESCRIPTION

Figure 1:
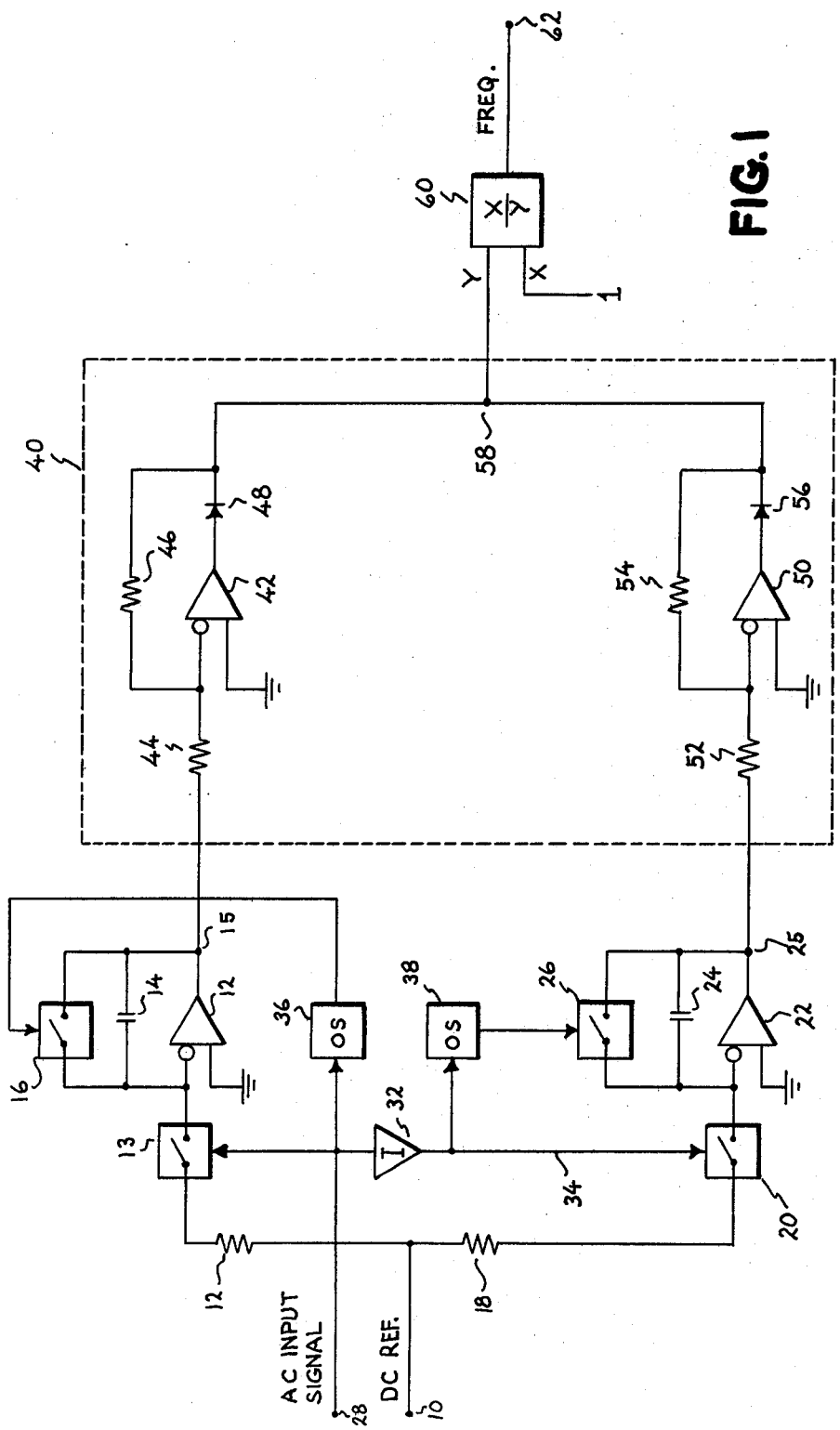
FIG. 1 is a schematic diagram illustrating the present invention in analog form.

Referring now to FIG. 1 which shows the present invention in its analog form, it is seen that a constant DC reference potential at input terminal 10 is applied by way of a resistor 12 to a suitable analog switch 13, the output of which is applied to an integrating circuit comprised of an operational amplifier 12 having a capacitor 14 connected between its output and its input. A second analog switch 16 is connected in parallel with the capacitor 14 and serves to discharge capacitor 14 as will be more fully understood as this description proceeds. If it is first assumed that switch 13 is closed and switch 16 is open, it is seen that the DC reference potential at 10 will be furnished to the integrating circuit described and there will be provided at its output 15 the integral of the DC reference potential; that is, the output at point 15 will gradually ramp downwardly at a constant rate dependent upon the value of the DC reference signal.

In a similar manner the DC reference potential at terminal 10 is applied via a resistor 18 to an additional analog switch 20 the output of which is provided to a second integrating circuit, identical to that described above, which includes an operational amplifier 22 having a capacitor 24 connected between its output and its input. An analog switch 26 is connected in parallel with the capacitor 24 to selectively discharge capacitor 24. In a manner similar to that described above, when switch 20 is closed and switch 26 is open, there will appear at the output of the integrating circuit (node 25) a signal which ramps downwardly at the same constant rate as did the signal at node 15.

The operation of switches 13, 16, 20 and 22 (which may be, for example, DG 201 switches by Siliconix, Inc.) is a function of the AC signal the frequency of which it is desired to measure. As illustrated, this AC signal is applied to terminal 28 and from that point is applied to switch 13, by way of line 30, as the operational control of that switch. The AC signal at terminal 28 is also applied by way of an inverter 32 and line 34 to the switch 20. The AC signal is also applied to a leading edge monostable multivibrator or one shot 36, the output of which is applied as the operational control of switch 16. In a similar manner, the output of the inverter 32 is applied to a one shot 38 the output of which serves as the operating signal for switch 26.

The two output signals from the two integrating circuits, that is, the signals at nodes 15 and 25 are applied to a comparison circuit in the form of maximum value gate 40 which serves to invert the two signals and provide an output representative of the larger of these two signals. In its simpliest form, if perfect diodes were available, the gate could take on the simple form of two diodes, one connected with its cathode to node 15 and the other connected with its cathode to node 25 with the anodes of these two diodes being tied together. The signal at the junction point of the two diode anodes would thus represent the larger of the two negative signals. This system could, in fact, be used if less than very accurate results were required. In order to provide more accurate results, however, one possible implementation of the maximum value gate is illustrated within the dashed line block 40. As shown, the signal at node 15 is applied to the inverting input of an operational amplifier 42 by way of a resistor 44. The operational amplifier 42 has its non-inverting input tied to ground, its output is connected by way of diode 48 to node 58, and a feedback resistor 46 is connected between its inverting input and node 58. In a similar manner, the signal at node 25 serves as an input to the inverting input of an operational amplifier 50 by way of an input resistor 52. The non-inverting input of this amplifier is connected to ground, its output is connected by way of a diode 56 to the node 58, and its inverting input is connected to node 58 by way of feedback resistor 54. The operation of the two feedback resistors 46 and 54 connected from node 58 is to cause one of the operational amplifiers 42 or 50 having the most negative input to control the voltage at node 58. Thus, there appears at node 58, the output of the maximum value gate 40, a signal which is proportional to the larger of the two signals appearing at nodes 15 and 25 and of positive polarity. The signal at node 58, representing the larger of the period just measured and that presently being measured, is applied as a "Y" input to an analog divider 60 the "X" input of which is connected to a signal representing the numerical value one. As such the output of the divider circuit 60 at point 62 will represent the frequency of the input signal.

Figure 2:
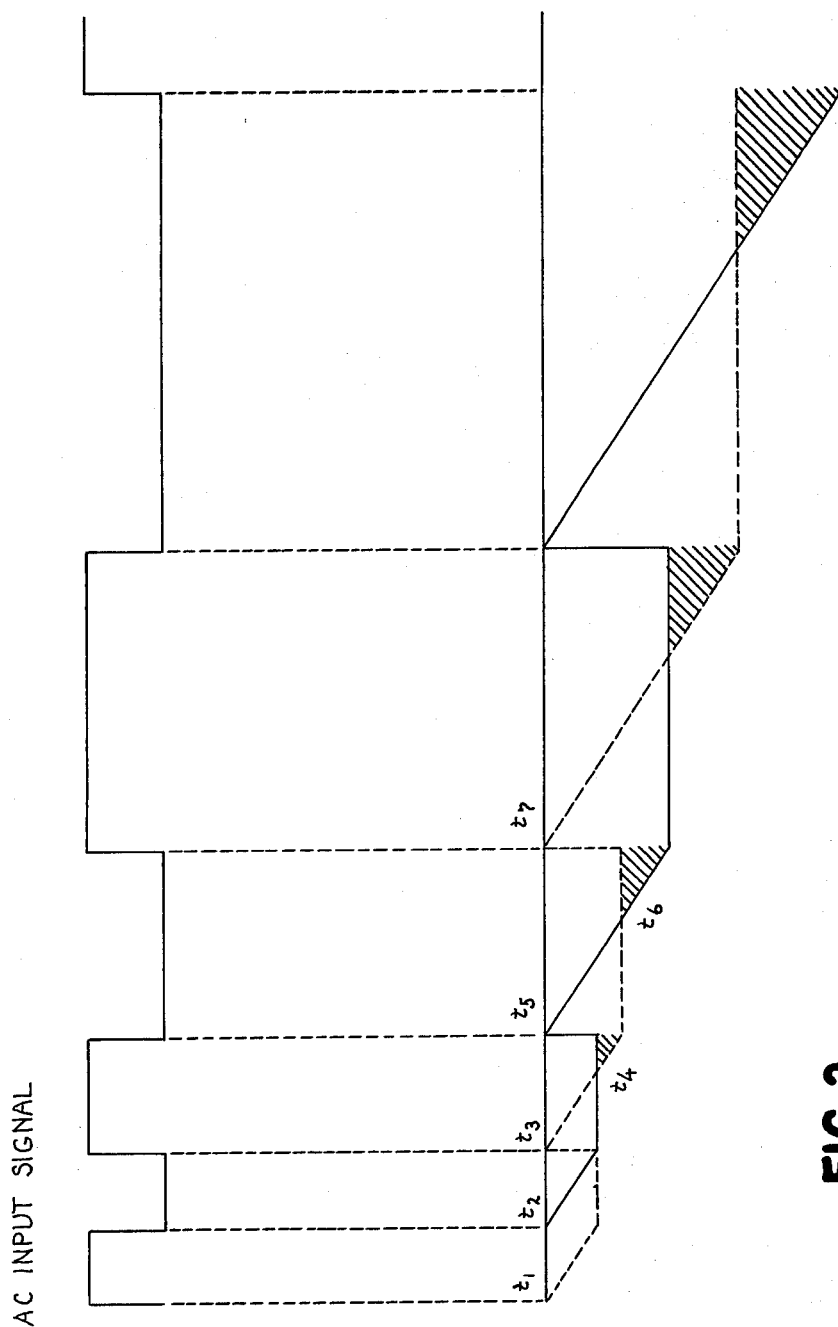
FIG. 2 illustrates traces which are helpful in understanding the operation of the present invention; and, FIG. 3 is a schematic diagram illustrating the present invention in digital form.

The operation of the circuit of FIG. 1 is best understood when considered in conjunction with the graphical representation of FIG. 2. In FIG. 2, the upper trace represents the AC input signal and the lower trace, the inverse of the value of the signals appearing at nodes 15 and 25 of FIG. 1. As illustrated in the lower trace, the dash line depiction is the representation of the signal at node 15 while the solid line depiction is that appearing at node 25. When the AC input signal goes relatively positively, switch 13 will be closed and, by virtue of the output of the one shot 36, switch 16 will also be closed momentarily to thus discharge capacitor 14. With switch 13 being held closed, it is seen that the integrating circuit of amplifier 12 and capacitor 14 will ramp at a fixed rate as illustrated by the dash line between times $t_1$ and $t_2$. At time $t_2$ the AC input signal drops to a relatively negative value. Switch 13 will open and switch 26 will momentarily close to discharge capacitor 24. Switch 20 will also close allowing the DC reference voltage at terminal 10 to be applied to and be integrated by the integrator circuit of operational amplifier 22 and capacitor 24. As such, beginning at time $t_2$, the output signal appearing at node 25 will begin to change at the constant rate as shown by the solid line between times $t_2$ and $t_3$. During the time period $t_2$ to $t_3$, gate 40 will provide, at its output node 58, the reciprocal of the value which is being retained by the upper integrating circuit, e.g., the value at node 15 since it is the larger of the two values.

At time $t_3$ the AC input signal once again goes positive and, in accordance with the present description, with closing of switch 16, capacitor 14 will be discharged. Switch 13 will again close and once more the upper integrator will be brought into operation while at the same time switch 20 will be opened to thus retain the value achieved by the lower integrator. The signal at node 15 will once again ramp at the constant rate and the output at node 58 will now be the reciprocal of the value of the signal at node 25 until at time $t_4$ when the signal at node 15 is greater than that at node 25, at which time the gate 40 will provide at node 58 the larger or the greater of the two signals, that is, that at node 15. This alternating action is repeated each time the AC input signal changes its relative potential with the output at node 58 always representing the larger of the two signals at nodes 15 and 25.

The shaded area in the lower trace of FIG. 2 represents the improvement achieved by the present invention. It is seen that it is not necessary to wait until the end of a half cycle period to get an indication that the frequency is decreasing, but that such an indication is provided as soon as the period of the half cycle being measured exceeds that of the immediately preceding half cycle the value of which has been retained by the other integrating means. This earlier indication of a decreasing frequency is of great value in many instances and allows faster response than is possible with systems in which the entire half period must be determined before an indication that the frequency is dropping can be obtained. It is apparent that if the frequency is increasing, the present invention does not represent a significant or substantial improvement over the prior systems since the period of the half cycle being measured will, of course, be shorter than the preceding half cycle and thus an earlier indication would be divided in either event.

Figure 3:
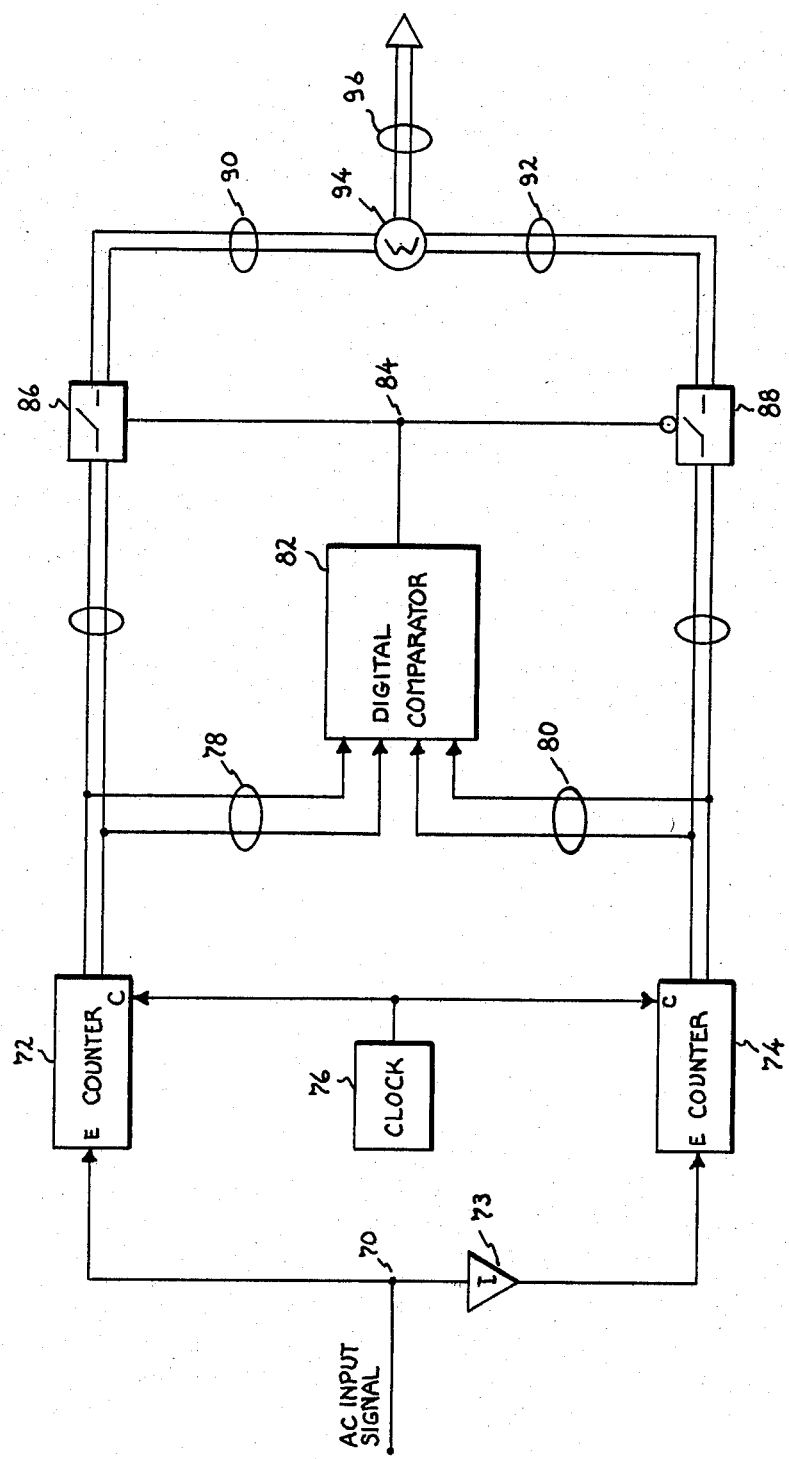

Reference is now made to FIG. 3 which illustrates the present invention in digital form. As shown, the AC input signal is applied to an input node 70 and thence to the enabling (E) gate of a first digital counter 72. The AC input signal is also applied by way of an inverter circuit 73 to the enabling input gate (E) of a second digital counter 74. A clock 76, running at a constant frequency, provides clock signals to the clock (C) gates of each of the two counters 72 and 74. Thus, when either the counters 72 or 74 is enabled, it will count at the rate determined by the output of the clock 76. By way of example for the frequencies which the present invention is contemplated for use; i.e., approximately 60 hertz, clock 76 could be a crystal controlled oscillator having an output approximating 200 kilohertz. The counters 72 and 74 are, in this illustrated embodiment, 16 bit counters which will count so long as they have an enabling input signal, will retain the count achieved when the enabling signal is removed, and will automatically reset upon the next application of an enabling signal. In addition, the counters are protected against overflow during very long count periods. It is, of course, apparent that such automatic resetting counters are not necessary and that appropriate reset signals could be generated as necessary.

The output of counter 72 is applied on lines 78 (16 in the present example) to a suitable digital comparator 82. Similarly, the output of counter 74 is applied by lines 80 to that same comparator. The output of comparator 82 at node 84 is, in the present example, a single bit signal which will have a binary 1 value when the count in counter 72 exceeds that in counter 74 and a 0 binary value when the counter 74 contains a higher count than does counter 72. The signal at node 84 is applied directly to a suitable digital switching means 86 and to the inverting input of a similar switching means 88. Thus, when the signal at node 84 is a binary 1 signifying that the counter 72 has the higher count, gate 86 will be closed and in a similar manner when the signal at node 84 is 0, gate 88 will be closed. The outputs of the gates 86 and 88 are applied respectively via lines 90 and 92 to a summing junction 94 the output of which, lines 96, will represent the higher of the two counts in the counters 72 and 74 which, similarly to the output at node 58 of FIG. 1, will be representative of the longer of the two periods.

As depicted in FIG. 3, when the AC input signal is of a relative positive value, counter 72 will be rendered functional to count the clock pulses from the clock 76. Similarly, when it is of a relative negative value, counter 74 will be enabled. Thus, each counter will retain, during the time the other counter is counting, the count prevously developed in much the same manner as was described with respect to integrated value derived in the analog system. The output on lines 96, of course, represents the period of the higher value of the period last completed (retained) and that presently being counted (measured). If a direct indication of frequency is required or desired, a suitable inversion of the signals on lines 96 must be accomplished, either by software or by other suitable means.

While the invention has been described in what are presently considered to be the preferred embodiments, modifications thereto will readily occur to those skilled in the art. For example, while both the analog and digital systems describe utilized first and second means to determine the period values; i.e., integrators or counters, it is apparent that a single counter could be used so long as some additional methods such a buffer were utilized to store the value representing the previous period. In a digital system, for example, this additional means could comprise a buffer register which receives the counter outputs in parallel at the initiation of a change in the relative polarity of the input signal. The buffer register content would then be compared with the content of the counter as the new count is begun. Also, although the input signal has been shown in the form of a square wave, it is apparent that the present invention is applicable to other forms of alternating current, such as sine wave. In the case of a sine wave, it may be necessary to place a suitable zero crossing detector at the input of the AC input signal in order to accurately determine the termination points of the alternate half cycles. It is not desired, therefore, that the invention be limited to these specific embodiments shown and described and it is intended to cover within the depending claims all such modifications as fall within the true spirit and scope of the invention.

What is claimed is:

1. A method of measuring the frequency of an alternating current signal comprising:
   (a) repetitively developing first and second signals having values representative, respectively, of the times said alternating current signal exist in alternate one-half cycles;
   (b) retaining the most recently developed of said values representing a period of a single half cycle; and
   (c) continuously comparing the retained value with the value presently being developed to provide an output signal representative of the greater thereof, said output signal being indicative of the frequency of said alternating current signal.

2. The method in accordance with claim 1 wherein said first and second signals are analog signals.

3. A method in accordance with claim 1 wherein said first and second signals are each a digital count.

4. A method in accordance with claim 1 further including the step of calculating the reciprocal of said output signal to thereby generate a signal directly proportional to the apparent frequency of said alternating current signal.

5. A method for measuring the frequency of an alternating current signal comprising:
   (a) developing a first signal having a value representative of the time said alternating current signal has a first relative polarity;
   (b) retaining said first value while developing a second signal having a second value;
   (c) developing said second value representative of the time said alternating current signal has a second relative polarity; and
   (d) continuously comparing said retained first value with the extant second value to provide an output signal representative of the greater thereof, said output signal being indicative of the apparent frequency of said alternating current signal.

6. A method in accordance with claim 5 wherein said first and second signals are analog signals.

7. The method in accordance with claim 5 wherein said first and second signals are each a digital count.

8. The method in accordance with claim 5 further including the step of calculating the reciprocal of said output signal to thereby generate a signal directly proportional to the apparent frequency of said alternating current signal.

9. A circuit for developing an output signal representative of an alternating current input signal comprising:
   (a) means for developing a first signal having a first value representative of the time period of said alternating current signal has a first relative polarity and for retaining said first value during the period a second value is being developed;
   (b) means for developing a second signal having said second value representative of the time said alternating current has a second relative polarity; and
   (d) means for continuously comparing the retained first value with said second value to provide an output signal representative of the greater of said first and second values, said output signal being indicative of the frequency of said alternating current signal.

10. The invention in accordance with claim 9 wherein said means to develop said first and second signals each includes integrating means.

11. The invention in accordance with claim 9 wherein said first and second means for developing said first and second signals each comprises a digital counter.

12. The invention in accordance with claim 11 in which said means for comparing comprises a digital comparator.